United States Patent
Cheng et al.

(10) Patent No.: US 6,724,784 B2
(45) Date of Patent: Apr. 20, 2004

(54) OPTICAL WAVELENGTH LOCKER MODULE HAVING A HIGH THERMAL CONDUCTIVE MATERIAL

(75) Inventors: Ling Cheng, Wyomissing, PA (US); Kaushal Verma, Breinigsville, PA (US); Mark Meyers, Allentown, PA (US); Mark A. Eshelman, Macungie, PA (US); Richard B. Bylsma, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 55 days.

(21) Appl. No.: 10/123,671

(22) Filed: Apr. 15, 2002

(65) Prior Publication Data

US 2003/0193983 A1 Oct. 16, 2003

(51) Int. Cl.$^7$ ............................................. H01S 3/098
(52) U.S. Cl. ............................................ 372/18; 372/34
(58) Field of Search ............................... 372/32, 34, 65

(56) References Cited

U.S. PATENT DOCUMENTS

| | | | |
|---|---|---|---|
| 5,212,584 A | | 5/1993 | Chung |
| 5,661,835 A | * | 8/1997 | Kato et al. ................... 385/92 |
| 5,825,792 A | | 10/1998 | Villeneuve et al. |
| 6,236,667 B1 | | 5/2001 | Broutin et al. |
| 6,243,403 B1 | | 6/2001 | Broutin et al. |
| 2002/0041611 A1 | * | 4/2002 | May ....................... 372/29.02 |
| 2003/0081309 A1 | * | 5/2003 | Nishi et al. ............... 359/337.2 |

* cited by examiner

Primary Examiner—Leon Scott, Jr.

(57) ABSTRACT

The present invention provides an optical filter module. In one embodiment, the wavelength locker module includes an optical interferometer or filter, such as an etalon. In addition, the wavelength locker module also includes an electrically nonconductive material having a high thermal conductivity substantially surrounding the etalon.

19 Claims, 3 Drawing Sheets

OPTICAL WAVELENGTH LOCKER MODULE HAVING A HIGH THERMAL CONDUCTIVE MATERIAL

TECHNICAL FIELD OF THE INVENTION

The present invention is directed, in general, to optical devices and, more specifically, to an optical wavelength locker module having an electrically nonconductive material with a high thermal conductivity and methods of manufacture and operation thereof.

BACKGROUND OF THE INVENTION

In current technology, optical fiber communication systems provide for low loss and very high information carrying capacity. In practice, the bandwidth of optical fiber may be utilized by transmitting many distinct channels simultaneously using different carrier wavelengths. The associated technology is called wavelength division multiplexing. In a dense wavelength division multiplexing (DWDM) system, different wavelengths are closely spaced to increase fiber transmission capacity. If it becomes necessary to add further channels to an existing optical fiber, even denser wavelength spacing may be used in the future.

A wavelength stabilized laser is a recently developed component of DWDM systems. In a DWDM system, a single semiconductor laser device may be used to provide light at several predetermined wavelengths, each corresponding to a different channel. Unfortunately, some laser sources, for example, distributed feedback (DFB) lasers, exhibit wavelength drift over time, in excess of the requirements for DWDM. As a result, the wavelength of the device tends to change with aging under continuous power. Thus, to maximize the number of channels, lasers with stable and precise wavelength control are employed to provide narrowly spaced, multiple wavelengths. As the wavelength spacing decreases, wavelength stabilization takes on a more important role.

Typically, lasers are tuned by varying the wavelength or, equivalently, the laser frequency by providing a feedback circuit employing an optical interferometer. In many conventional DWDM systems, a stable optical interferometer, such as an etalon, is used in a feedback circuit to provide the necessary wavelength stabilization. Those who are skilled in the art understand that an etalon is an interferometer typically consisting of a plate of silica having two parallel faces that create an optical interference by reflecting a portion of each ray of light incident upon the faces. Since laser wavelength is a function of laser temperature, lasers are typically tuned by altering their temperature with a thermoelectric cooler (TEC). Unfortunately, although the temperature of the lasers may be monitored and altered as needed, the resulting temperature changes of the lasers may also dramatically affect the temperature of the etalon mounted near the laser.

A change in the temperature of an etalon often limits the precision of the wavelength stabilization of the laser because etalons are typically manufactured from temperature sensitive materials. A change in the temperature will lead to changes in refractive index and thickness of each etalon fabricated from the temperature sensitive materials, allowing optimal functioning only under a very stable temperature environment. Thus, the etalon's temperature stability is of integral concern in the wavelength stabilization of the lasers in optoelectronic devices. In current packaging techniques, etalons are typically mounted on the same platform or substrate of an application specific carrier (ASC) as the laser, where both are mounted in a package having its temperature monitored and altered by a TEC. Thus, although the etalon is within the same temperature-controlled environment as the laser, a temperature gradient still typically exists between the surface of the etalon mounted directly to the substrate and those surfaces not in direct contact with the substrate due to the low thermal conductivity of the etalon material. Typically, a change in the temperature of the surrounding environment will result in a change in the etalon temperature.

Attempts to correct this temperature gradient of the optical interferometers (e.g., etalons) employed in DWDM systems have met with marginal results. One approach has been to construct the etalons from materials that are not as temperature sensitive as those typically employed. Unfortunately, excessive costs in manufacturing etalons using less temperature sensitive materials discourage wavelength locker manufacturers from employing such materials. More specifically, these exotic low temperature sensitivity materials are typically fragile, difficult and expensive to initially manufacture, and difficult to process into a finished etalon.

Another approach has been to employ an "air-gap" etalon as the wavelength locker in the DWDM system. Air-gap etalons include two plates of silica, or similar material, positioned parallel to each other with a small air-gap in between them. The air-gap has a refractive index, which is less sensitive to temperature than materials such as fused silica. However, these special etalons are also costly and time consuming to manufacture since four sides (two sides on each silica plate) must be polished to create the necessary interference. In addition, the two plates must be precisely aligned parallel to each other to provide interference of the incoming light at the appropriate wavelength, a task not easily achieved.

Accordingly, what is needed in the art is an apparatus for maintaining the temperature of a wavelength locker used in optoelectronic laser devices that does not suffer from the deficiencies found in the prior art.

SUMMARY OF THE INVENTION

To address the above-discussed deficiencies of the prior art, the present invention provides an improved optical wavelength locker module. In one embodiment, the wavelength locker module includes an optical interferometer or filter, such as an etalon. In addition, the wavelength locker module also includes an electrically nonconductive material having a high thermal conductivity substantially surrounding the etalon.

In another embodiment, the present invention provides a method involving an optical wavelength locker module. In one embodiment, the method includes providing an optical interferometer or filter, such as an etalon. Also, the method provides placing an electrically nonconductive material having a high thermal conductivity substantially around the etalon, where the material is capable of reducing a temperature gradient across the etalon.

In yet another embodiment, the present invention provides an optical assembly. In one embodiment, the optical assembly includes a substrate having conductive traces, and an optical subassembly mounted on the substrate and having a laser therein. In this embodiment, the laser is configured to generate a beam of light. The optical assembly further includes an optical wavelength locker module positioned on the substrate to receive the beam of light from the laser. The wavelength locker module includes an optical interferometer or filter, such as an etalon, and an electrically nonconductive material having a high thermal conductivity substantially surrounding the etalon.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 1:
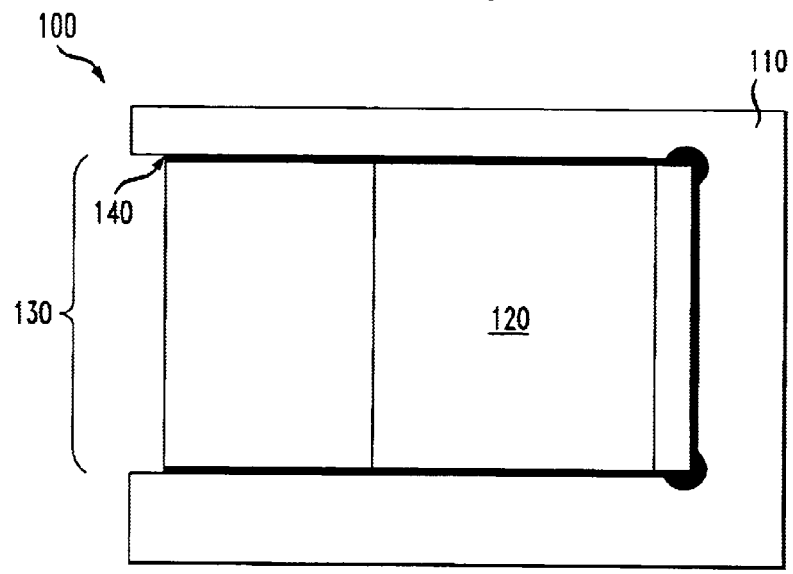
FIG. 1 illustrates a top view of one embodiment of an optical wavelength locker module constructed according to the principles of the present invention.

Referring initially to FIG. 1, illustrated is a top view of one embodiment of an optical wavelength locker module 100 constructed according to the principles of the present invention. The optical wavelength locker module 100 includes a frame 110. In one embodiment, an etalon 120 is positioned in the cavity 130 for stabilizing the wavelength of an optoelectronic laser. Of course, optical interferometers other than etalons, capable of having a temperature gradient thereacross during use, are also within the broad scope of the present invention.

In an exemplary embodiment of the present invention, the cavity 130 is constructed to receive the etalon 120. In another embodiment, the frame 110 is formed around the etalon 120, substantially surrounding the etalon 120. In accordance with the principles discussed herein, the frame 110 of the optical wavelength locker module 100 is composed of an electrically nonconductive material having a high thermal conductivity. As used herein, the term "high thermal conductivity" includes materials having a thermal conductivity of at least 60 watts per meter-Kelvins (W/m-K). By substantially surrounding the etalon 120, the high thermal conductive material of the frame 110 reduces or eliminates the temperature gradient thereacross.

As illustrated, the optical wavelength locker module 100 may further include an adhesive 140. In such embodiments, the adhesive 140 is located between the frame 110 and the etalon 120 positioned in the cavity 130 and substantially surrounded by the frame 110. Thus, the adhesive 140 may be employed to affix the etalon 120 in the cavity 130 of the optical wavelength locker module 100. Advantageously, the adhesive 140 may be chosen such that its adhesive properties are not affected by high temperatures that may be present in the frame 110 or across the etalon 120. For example, in one embodiment, the adhesive 140 may be epoxy, however other adhesives having similar properties may also be employed. Once the etalon 120 is affixed within the cavity 130, the complete optical wavelength locker module 100 may be mounted on the substrate of an optical assembly, for example, an application specific carrier (ASC) for an optoelectronic laser.

By constructing the frame 110 of the optical wavelength locker module 100 from a material having a high thermal conductivity, the frame 100 provides for high thermal conductivity around the etalon 120 by substantially surrounding it. As discussed above, when employed to stabilize the wavelength of an optoelectronic laser, an interferometer, such as an etalon, may experience a temperature gradient or differential, for example, between its top and bottom sides, even if packaged with the laser near a TEC. Since etalons are typically manufactured from temperature sensitive materials, such a temperature gradient can detrimentally affect the ability of the etalon to perform its function.

Using the optical wavelength locker module 100, having a frame 110 with a high thermal conductive material, temperature differential across an etalon 120 may be substantially reduced or even eliminated. More specifically, if the bottom side of the etalon 120 becomes heated above its top side (or vice-versa), the high thermal conductivity of the material in the frame 110 surrounding the etalon 120 provides an avenue for heat emanating in the bottom of the etalon 120 to transfer to the top of the etalon 120. As a result, the temperature across the etalon 120 may be substantially equalized.

In advantageous embodiments, the electrically nonconductive frame 110 may be constructed of ceramic, silicon or beryllium oxide, each of which are electrically nonconductive but has a high thermal conductivity, as defined herein. Those skilled in the art may also determine other appropriate and useful nonconductive materials having a high thermal conductivity, without departing from the scope of the present invention. In an alternative embodiments, however, the frame 110 may be composed of a metallic material, for example, copper. In other embodiments, however, the frame 110 may be composed of silver, gold, aluminum, or other metallic material having a high thermal conductivity.

Figure 2A:
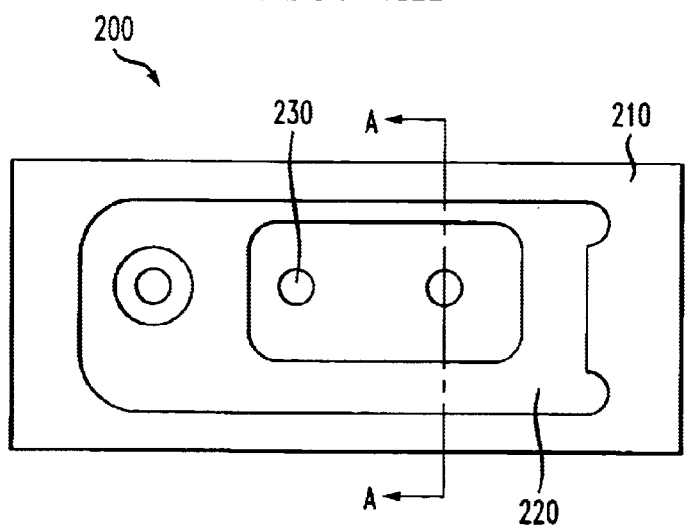
FIG. 2A illustrates a top view of another embodiment of an optical wavelength locker module constructed according to the principles of the present invention.
Figure 2B:
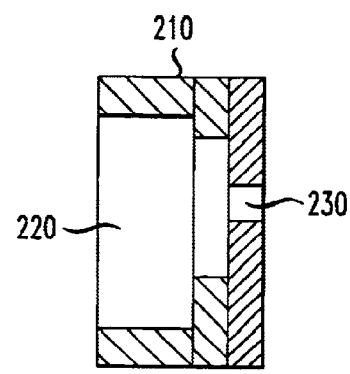
FIG. 2B illustrates a side view of the optical wavelength locker module illustrated in FIG. 2A.

Attention is now turned to FIGS. 2A and 2B. FIG. 2A illustrates a top view of another embodiment of an optical wavelength locker module 200 constructed according to the principles of the present invention. FIG. 2B illustrates a section side view of the optical wavelength locker module 200 illustrated in FIG. 2A taken along line A—A. As with the embodiment illustrated in FIG. 1, the embodiment of the present invention illustrated in FIGS. 2A and 2B includes a frame 210 and a cavity 220 for receiving an interferometer, such as an etalon, (not illustrated) into the optical wavelength locker module 200. In addition, although not illustrated, an adhesive may be employed to affix an etalon into the cavity 220, allowing the frame 210 to substantially surround the etalon.

Unlike the embodiment in FIG. 1, however, the optical wavelength locker module 200 in FIG. 2 is a carrier for a complete optical wavelength locker assembly. More specifically, since the frame 210 is composed of an electrically nonconductive material, the module 200 may include light sensor chips (not illustrated) and traces (not illustrated) for providing electrical interconnection between the components of an optical assembly. In addition, in this embodiment, the high thermal conductive material comprising the frame 210 of the optical wavelength locker module 200 includes apertures (one of which is designated 230) for incoming beams of light generated by an optoelectronic laser (not illustrated) to pass through during use of the optical wavelength locker module 200.

Figure 3A:
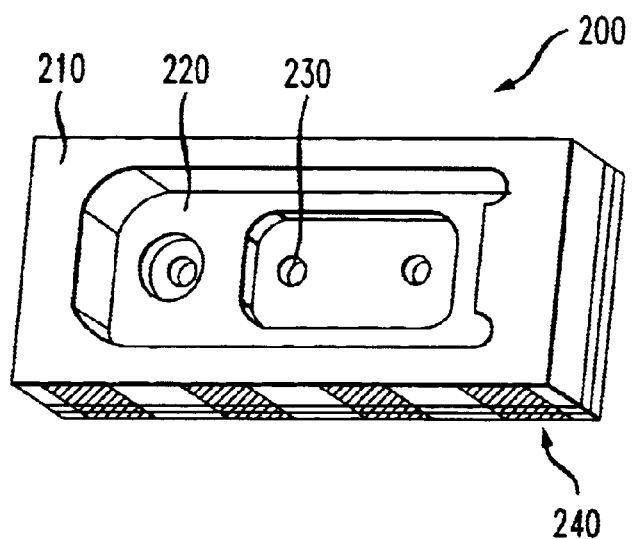
FIG. 3A illustrates an isometric top view of the optical wavelength locker module illustrated in FIGS. 2A and 2B.

Looking briefly at FIG. 3A, illustrated is an isometric top view of the optical wavelength locker module 200 illustrated in FIGS. 2A and 2B. In addition to the frame 210, cavity 220 and apertures 230, the optical wavelength locker module 200 further includes electrically conductive mounting pads (one of which is designated 240) located on a mounting side of the optical wavelength locker module 200. The mounting pads 240 may be used like the bond pads on integrated circuit chips to electrically interconnect the components of the optical wavelength locker module 200, for example, with solder, to an optical assembly (not illustrated) having an optoelectronic laser.

Figure 3B:
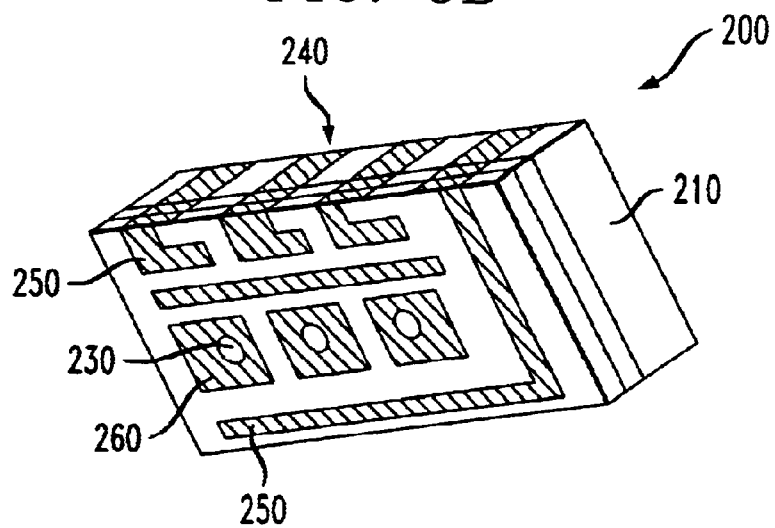
FIG. 3B illustrates an isometric bottom view of the optical wavelength locker module illustrated in FIGS. 2A, 2B and 3A.

Turning to FIG. 3B, illustrated is an isometric bottom view of the optical wavelength locker module 200 illustrated in FIGS. 2A, 2B and 3A. Now illustrated on the back side of the optical wavelength locker module 200 are electrically conductive traces 250 formed on the electrically nonconductive frame 210. The traces 250 are used to electrically interconnect the mounting pads 240 with light sensor pads (one of which is designated 260) located on the back side of the frame 210.

The light sensor pads 260 surround the apertures 230 in the optical wavelength locker module 200, and are used to mount light sensor chips (not illustrated) to the optical wavelength locker module 200. Such light sensor chips are used in combination with an optical interferometer (such as an etalon) to provide feedback for wavelength stabilization of the optoelectronic laser. The light sensor chips, in an advantageous embodiment, are photodetectors and are mounted to each of the light sensor pads 260 to sense beams of light passing through the apertures 230 from such a laser. Those skilled in the art are familiar with the use of such light sensor chips in stabilizing the wavelength of optoelectronic lasers, as well as the various types of light sensor chips that could be used with an optical wavelength locker module constructed according to the principles of the present invention.

By providing a frame 210 comprised of a nonconductive material, the embodiment of the present invention in FIGS. 3A and 3B enjoys substantial utility in that electrical interconnections may be formed by the conductive traces 250, without creating a short-circuit across the frame 210. As a result, rather than having to separately mount both a carrier for the light sensor chips and a separate optical wavelength locker assembly to the substrate of an optical assembly, the present invention provides a single carrier or module having the optical interferometer and the requisite light sensor components, as well as any conductive traces and mounting pads, used for wavelength stabilization in optoelectronic applications.

In addition, as discussed in detail above, such an optical wavelength locker module 200 manufactured according to the present invention also provides a thermal conduit for dispersing heat, or otherwise reducing the temperature gradient, across an optical interferometer, such as an etalon, in order to prevent wavering in the wavelength stabilization function of the etalon. As with the embodiment discussed with respect to FIG. 1, the frame 210 of the optical wavelength locker module 200 in FIG. 2 may also have various structures allowing it to perform as a temperature equalizer. However, such a structure is not required by the present invention. Moreover, an optical wavelength locker module according to the present invention is employable in almost any optoelectronic environment where an optical wavelength locker is used, while still retaining the benefits of the various embodiments described herein.

Figure 4:
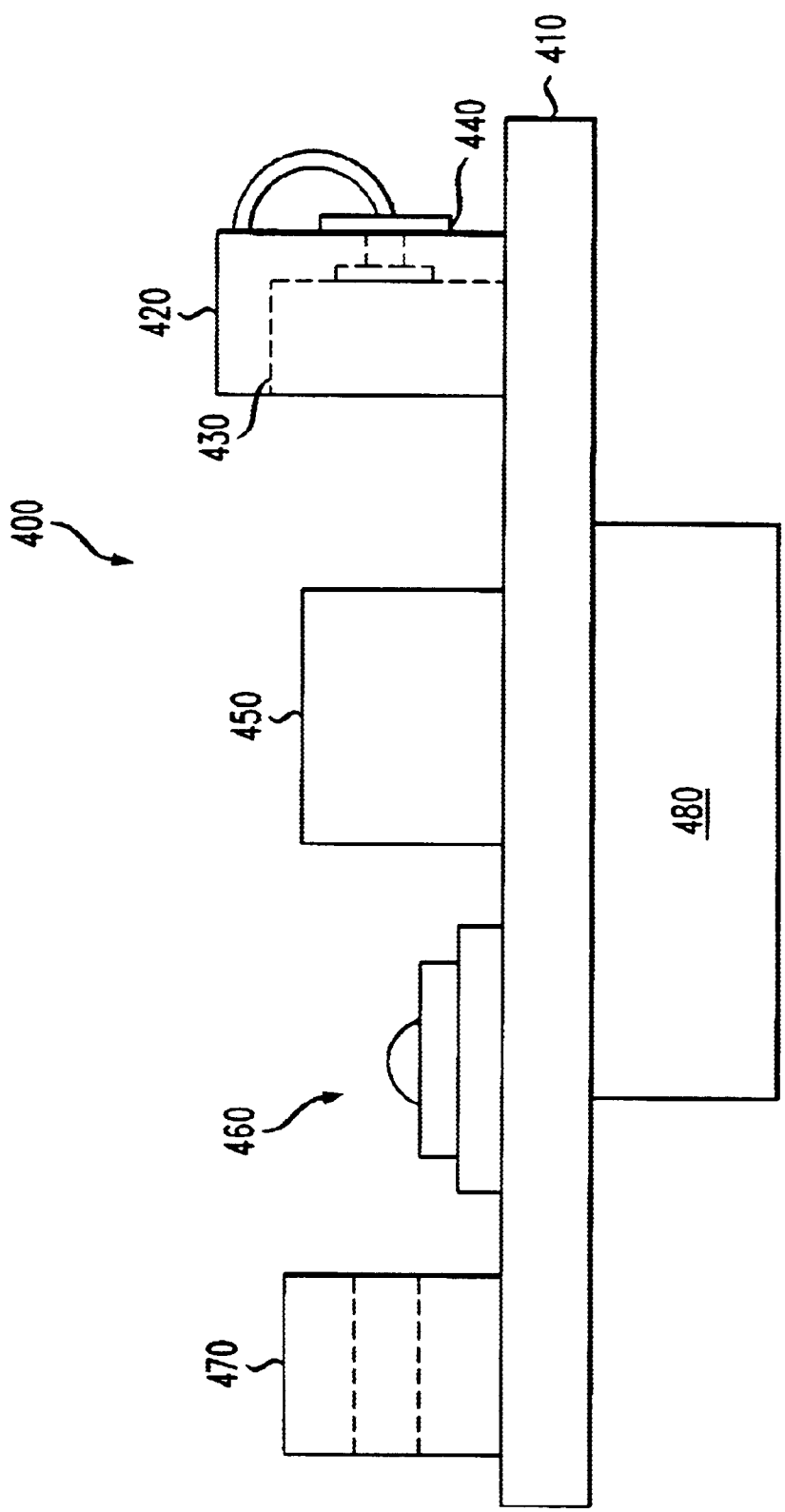
FIG. 4 illustrates one embodiment of an optical assembly incorporating an optical wavelength locker module constructed according to the principles of the present invention.

Referring finally to FIG. 4, illustrated is one embodiment of an optical assembly 400 incorporating an optical wavelength locker module constructed according to the principles of the present invention. In an advantageous embodiment, the optical assembly 400 is an optoelectronic laser assembly for use in electronic devices. The optical assembly 400 includes a substrate 410 on which multiple components are mounted. In accordance with conventional practice, the substrate 410 may be composed of silicon or other semiconductor material having similar properties.

Mounted on the substrate 410 is an optical wavelength locker module 420 constructed according to the principles of the present invention. The optical wavelength locker module 420 includes an etalon 430 affixed within the optical wavelength locker module 420, such that the optical wavelength locker module 420 substantially surrounds the etalon 430. In addition, the optical wavelength locker module 420 includes light sensor chips 440 mounted on light sensor pads (not separately designated) located on the back side of the optical wavelength locker module 420. Similar to the embodiment illustrated in FIGS. 3A and 3B, by combining the etalon 430 and the light sensor chips 440 in a single unit, the optical wavelength locker module 420 in FIG. 4 eliminates the need for separately mounting these various components to the substrate 410.

The optical assembly 400 further includes a collimating lens 450 configured to manipulate and focus a beam of light (e.g., a laser) into the etalon 430 of the optical wavelength locker module 420 during operation of the optical assembly 400. Advantageously, an optical wavelength locker module constructed according to the present invention may be employed on an optical assembly with conventional collimating lenses. Those who are skilled in the art could readily select appropriate lenses for use in an application incorporating an embodiment of the present invention.

The optical assembly 400 also includes an optical subassembly (OSA) 460. In accordance with conventional practice, the OSA 460 includes an optoelectronic laser (not illustrated) for generating a laser beam to be fed through the collimating lens 450 and into the etalon 430 to provide a feedback loop for stabilizing the wavelength of the laser beam within the OSA 460. The optical assembly 400 still further includes an isolator 470. As is well known, the isolator 470 may be employed in the optical assembly 400 to prevent the reflection of the output laser beam generated by the OSA 460 back into the OSA 460, and thus prevent performance degradation of the light generating components within the OSA 460. More specifically, the laser in the OSA 460 generates a laser beam that is output from the optical assembly via the isolator 470. Simultaneously, the laser generates a feedback laser beam that is focused through the collimating lens and into the etalon 430 of the present invention to provide wavelength feedback for the laser in the OSA 460.

In operation, the laser generated by the OSA 460 may be of a conventional type, such as a distributed feedback (DFB) laser, a distributed Bragg reflector (DBR) laser, or the like. As mentioned above, the wavelength of the laser beam generated by such lasers is a function of the temperature of the laser. In addition, the wavelength of a DBR laser is a function of both the temperature and a bias signal that is provided to the Brag reflector section of the DBR laser. Thus, temperature adjustments used to adjust the wavelength of the laser will typically affect the temperature across the etalon 430 employed to stabilize the wavelength of that laser.

As illustrated in FIG. 4, a temperature control device, which may be, for example, a thermoelectric cooler (TEC) 480, is thermally coupled to the OSA 460 to control its temperature. By providing a frame composed of an electrically nonconductive material with a high thermal conductivity that surrounds the etalon 430, the optical wavelength locker module 420 of the present invention substantially prevents or eliminates any temperature gradient present across the etalon 430, while the etalon 430 stabilizes the wavelength of the laser. In accordance with the principles discussed herein, by substantially preventing a temperature gradient across the etalon 430, the wavelength stabilization performance of the etalon 430 may be optimized.

Although the present invention has been described in detail, those skilled in the art should understand that they can make various changes, substitutions and alterations herein without departing from the spirit and scope of the invention in its broadest form.

What is claimed is:

1. An optical wavelength locker module, comprising:
  a housing comprised of an electrically nonconductive material having a high thermal conductivity and having a cavity formed therein and having at least one aperture formed therethrough; and
  an optical filter located within said cavity such that said optical fiber is substantially surrounded by said housing and optically aligned with said at least one aperture.

2. The optical wavelength locker module as recited in claim 1 wherein said electrically nonconductive material is selected from the group consisting of ceramic, silicon and beryllium oxide.

3. The optical wavelength locker module as recited in claim 1, wherein said optical filter is an etalon.

4. The optical wavelength locker module as recited in claim 1 further including at least one light sensor pad, proximate said at least one aperture, for mounting a light sensor chip configured to sense said beam of light.

5. The optical wavelength locker module as recited in claim 4, wherein said housing further includes a plurality of conductive traces located thereon and connected to said at least one light sensor pad and said at least one conductive mounting pad.

6. The optical wavelength locker module as recited in claim 1, wherein said housing further includes at least one conductive mounting pad located thereon for mounting said optical wavelength locker module to a substrate.

7. The optical wavelength locker module as recited in claim 1, wherein said optical wavelength locker module forms a portion of an optical assembly comprising a substrate having conductive traces and an optical subassembly mounted on said substrate and having a laser therein, said laser configured to generate a beam of light, and wherein said optical wavelength locker module is positioned on said substrate to receive said beam of light.

8. A method of manufacturing an optical wavelength locker, comprising:
  providing a housing comprised of an electrically nonconductive material having a high thermal conductivity and having a cavity formed therein and having at least one aperture formed therethrough; and
  placing an optical filter in said housing such that said optical filter is substantially surrounds said optical filter and optically aligned with said at least one aperture.

9. The method as recited in claim 8 wherein said providing includes providing a housing comprised of a material selected from the group consisting of placing ceramic, silicon or beryllium oxide.

10. The method as recited in claim 8, wherein providing includes providing a housing having at least one light sensor pad, proximate said at least one aperture, for mounting a light sensor chip configured to sense said beam of light.

11. The method as recited in claim 10, further including mounting said optical wavelength locker module to a substrate with at least one mounting pad located on said electrically nonconductive material.

12. The method as recited in claim 11, wherein said providing includes providing a housing having a plurality of conductive traces located thereon and connected to said at least one light sensor pad and said at least one conductive mounting pad.

13. The method as recited in claim 8 further including forming at least one conductive mounting pad on said housing for mounting said optical wavelength locker module to a substrate.

14. The method as recited in claim 8, wherein said optical filter is an etalon.

15. An optical assembly, comprising:
  a substrate having conductive traces;
  an optical subassembly mounted on said substrate and having a laser therein, said laser configured to generate a beam of light; and
  an optical wavelength locker module positioned on said substrate to receive said beam of light, including:
    a housing comprised of an electrically nonconductive material having a high thermal conductivity and having a cavity formed therein and at last one aperture formed therethrough; and
    an optical filter located within said cavity such that said optical filter is substantially surrounded by said housing and optically aligned with said at least one aperture.

16. The optical assembly as recited in claim 15 wherein said electrically nonconductive material is selected from the group consisting of ceramic, silicon or and beryllium oxide.

17. The optical assembly as recited in claim 15, wherein said housing includes at least one light sensor pad, proximate said at least one aperture, for mounting a light sensor chip configured to sense a beam of light passing through said at least one aperture.

18. The optical assembly as recited in claim 17 wherein said housing further includes a plurality of conductive traces located thereon and connected to said at least one light sensor pad and said at least one conductive mounting pad.

19. The optical wavelength locker module as recited in claim 15 wherein said housing further includes at least one conductive mounting pad located thereon for mounting said optical wavelength locker module to a substrate.

* * * * *